US008418106B2

(12) United States Patent
Baumgartner et al.

(10) Patent No.: US 8,418,106 B2
(45) Date of Patent: Apr. 9, 2013

(54) TECHNIQUES FOR EMPLOYING RETIMING AND TRANSIENT SIMPLIFICATION ON NETLISTS THAT INCLUDE MEMORY ARRAYS

(75) Inventors: Jason R. Baumgartner, Austin, TX (US); Michael L. Case, Pflugerville, TX (US); Robert L. Kanzelman, Rochester, MN (US); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 124 days.

(21) Appl. No.: 12/872,490

(22) Filed: Aug. 31, 2010

(65) Prior Publication Data

US 2012/0054702 A1    Mar. 1, 2012

(51) Int. Cl.
*G06F 17/50* (2006.01)
(52) U.S. Cl. .......................................... 716/113
(58) Field of Classification Search ................. 716/100, 716/113
See application file for complete search history.

(56) References Cited

U.S. PATENT DOCUMENTS

| 6,378,112 | B1 | 4/2002 | Martin et al. |
| 6,691,078 | B1 | 2/2004 | Beer et al. |
| 6,698,003 | B2 | 2/2004 | Baumgartner et al. |
| 6,920,583 | B1 | 7/2005 | Morley et al. |
| 6,944,838 | B2 | 9/2005 | McMillan |
| 6,954,083 | B1 * | 10/2005 | Thornley et al. ................. 326/16 |
| 6,973,420 | B1 | 12/2005 | Tetzlaff |
| 6,975,976 | B1 | 12/2005 | Casavant et al. |
| 7,120,883 | B1 | 10/2006 | Antwerpen |
| 7,159,198 | B1 | 1/2007 | Norris et al. |
| 7,181,703 | B1 | 2/2007 | Borer |
| 7,203,915 | B2 | 4/2007 | Baumgartner et al. |
| 7,203,919 | B2 | 4/2007 | Suaris |
| 7,340,702 | B2 | 3/2008 | Wang |
| 7,383,166 | B2 | 6/2008 | Ashar et al. |
| 7,403,884 | B2 | 7/2008 | Hemmett |
| 7,412,674 | B1 | 8/2008 | Singhal et al. |
| 7,412,695 | B1 | 8/2008 | Dastidar et al. |
| 7,421,669 | B2 | 9/2008 | Baumgartner et al. |
| 7,689,955 | B1 | 3/2010 | Van Antwerpen et al. |
| 7,734,452 | B2 | 6/2010 | Baumgartner et al. |
| 2005/0193304 | A1 | 9/2005 | Abraham et al. |
| 2005/0273307 | A1 | 12/2005 | Hemmett |
| 2007/0050740 | A1 | 3/2007 | Jacobi et al. |
| 2008/0028347 | A1 | 1/2008 | Hiraoglu |
| 2008/0066034 | A1 | 3/2008 | Baumgartner et al. |
| 2008/0127002 | A1 | 5/2008 | Baumgartner et al. |
| 2008/0275679 | A1 | 11/2008 | Lin et al. |
| 2009/0184733 | A1 * | 7/2009 | Lilja .............................. 326/101 |

(Continued)

OTHER PUBLICATIONS

WIPO, International Search Report dated Feb. 15, 2011, International App. No. PCT/EP2010/064814.

(Continued)

*Primary Examiner* — Suchin Parihar
(74) *Attorney, Agent, or Firm* — Yudell Isidore Ng Russell PLLC (57) ABSTRACT

A technique for performing an analysis of a logic design (that includes a native memory array embodied in a netlist) includes detecting an initial transient behavior in the logic design as embodied in the netlist. The technique also includes determining a duration of the initial transient behavior and gathering reduction information on the logic design based on the initial transient behavior. The netlist is then modified based on the reduction information.

14 Claims, 4 Drawing Sheets

U.S. PATENT DOCUMENTS

| | | |
|---|---|---|
| 2009/0293032 A1 | 11/2009 | Oktem |
| 2010/0107132 A1 | 4/2010 | Bjesse |
| 2010/0218150 A1 | 8/2010 | Baumgartner et al. |
| 2010/0223584 A1 | 9/2010 | Baumgartner et al. |
| 2011/0093825 A1* | 4/2011 | Baumgartner et al. ....... 716/108 |

OTHER PUBLICATIONS

Kitchen et al.; "Temporal Decomposition for Logic Optimization"; Proceedings 2005 International Conference on Computer Design in San Jose, CA—USA; IEEE Oct. 2, 2005; pp. 697-702.

Lu et al.; "Sequential Equivalence Checking Based on K-th Invariants and circuit SAT Solving"; High-Level Design Validation and Test Workshop, 2005; 10th IEEE International—Nov. 30-Dec. 2, 2005;IEEE Nov. 30, 2005; pp. 45-51.

Case et al.: "Enhanced Verification by Temporal Decomposition"; Formal Methods in Computer-Aided Design, 2009; FMCAD 2009; IEEE Nov. 15, 2009; pp. 17-24.

Zang et al.; "A BDD-Based Algorithm for Analysis of Multistate Systems with Multistate Components"; IEEE Transactions on Computers; vol. 52; No. 12; Dec. 2003.

Jin et al.; "Power System Transient Stability Design using Reachability based Stability-Region Computation"; IEEE; pp. 338-342; 2005.

Tadmor et al.; "Shift Modes and Transient Dynamics in Low Order, Design Oriented Galerkin Models"; 45th AIAA Aerospace Sciences Meeting and Exhibit 8-11; Reno, Nevada; 2007; pp. 1-11.

Costa, Ramon R.; "Improving Transient Behavior of Model-Reference Adaptive Control"; Proceedings of the American Control Conference; San Diego, CA; Jun. 1999; pp. 576-580.

Lee, Eric—Non-Final Office Action dated Aug. 3, 2011; U.S. Appl. No. 12/394,560.

Gott, R.M. et al., Functional Formal Verification on Designs of pSeries Microprocessors and Communication Subsystems, IBM J. Res & Dev., vol. 49 No. 4/5, pp. 565-580, 2005.

Thuyen et al., Formal Verification of a Pervasive Interconnect Bus System in a High-Performance Microprocessor, Design, Automation & Test in Europe Conference & Exhibition, Apr. 16-20, 2007, pp. 1-6, IEEE.

Biere et al., 'Linear Encodings of Bounded LTL Model Checking', Logical Methods in Computer Science, vol. 2 pp. 1-64, 2006.

Schuppan, 'Liveness Checking as Safety Checking to Find Shortest Counterexamples to Linear Time Properties', Doctoral Thesis ETH No. 16268, Submitted to Swiss Federal Institute of Tecynology, Zurich, 2005.

Schuppan et al., 'Liveness Checking as Safety Checking for Infinite State Spaces', Electronic notes in Theoretical Computer Science, Infinity 2005, www.elsevier.nl/locate/entcs, pp. 1-18.

Burch, J., 'Verifying Liveness Properties by Verifying Safety Properties', LNCS (SpringerLInk), Computer-Aided Verification, vol. 531/1991, pp. 224-232, Springer Berlin/Heidelberg, 1991.

Baumgartner et al., U.S. Appl. No. 12/394,560—'Logic Design Verification Techniques for Liveness Checking with Retiming'; filed Feb. 27, 2009.

Baumgartner et al., U.S. Appl. No. 12/580,330—'Techniques for Analysis of Logic Designs with Transient Logic'; filed Oct. 16, 2009.

U.S. Appl. No. 13/403,799 entitled "Verification Techniques for Liveness Checking of Logic Designs"; Notice of Allowance dated Aug. 31, 2012.

U.S. Appl. No. 12/393,779 entitled "Logic Design Verification Techniques for Liveness Checking"; Final office action dated Aug. 9, 2012.

U.S. Appl. No. 12/394,560 entitled "Logic Design Verification Techniques for Liveness Checking With Retiming"; Notice of Allowance dated Apr. 13, 2012.

U.S. Appl. No. 12/394,560 entitled "Logic Design Verification Techniques for Liveness Checking With Retiming"; Final Office Action dated Jan. 18, 2012.

U.S. Appl. No. 12/580,330 entitled "Techniques for Analysis of Logic Designs With Transient Logic"; Notice of Allowance dated Jul. 24, 2012.

U.S. Appl. No. 12/393,779 entitled "Logic Design Verification Techniques for Liveness Checking"; Non-Final Office Action dated Dec. 23, 2011.

\* cited by examiner

TECHNIQUES FOR EMPLOYING RETIMING AND TRANSIENT SIMPLIFICATION ON NETLISTS THAT INCLUDE MEMORY ARRAYS

BACKGROUND

This disclosure relates generally to retiming and transient simplification of netlists and, more specifically, to techniques for employing retiming and transient simplification on netlists that include memory arrays.

In general, formal verification involves rigorously proving that an integrated circuit (IC) logic design (design) satisfies an associated specification. Typically, the specification of a verification problem includes a netlist representation of a design and a set of expected values for specified nets of the netlist that take the form of a trace. A 'netlist' comprises gates of various functions (which evaluate to Boolean values over time) and edges (which represent interconnections between the gates). A 'trace' may be a sequence of binary (i.e., '0' or '1') values applied to gates of a netlist over time or a sequence of ternary values (i.e., '0', '1', or 'X', where value 'X' refers to an unknown value) applied to gates of a netlist over time.

A gate may, for example, fall into one of four broad functional categories: constant gates, random gates, combinational gates, and state elements (e.g., registers and sequential gates, such as latches and flip-flops). A constant gate produces a logic level that does not vary with time. A random gate (also referred to as a primary input) may assume any logic level in any time-step independent of all other gates. A combinational gate is a logical element such as an AND gate, an OR gate, a NAND gate, a NOR gate, etc. A sequential gate has an associated initial value function and a next state function. The value of a sequential gate at time '0' (t0) is the value of the initial value function. The value of a sequential gate at time 'i+1' is equal to the value of the next state function of the sequential gate at time 'i'.

As an example, a verification problem may include determining whether a state exists in which a particular signal is asserted, where assertion of the particular signal indicates a fault. Using formal verification, an attempt is made to find a counter-example trace that includes a sequence of net values over time (states) that leads to an assertion of a particular signal or prove that no counter-example trace exists that leads to the assertion of the particular signal. Formal verification is often performed using state space search algorithms, which include unbounded and bounded exhaustive search algorithms. Bounded exhaustive search algorithms attempt to find an assertion of a particular signal that occurs within 'N' time-steps from an initial state of a design. Unbounded exhaustive search algorithms increase 'N' until no states are encountered that have not already been encountered for smaller values of 'N' (a condition referred to as a 'fixed-point'). If no path from an initial state to a violating state (i.e., a state in which the particular signal is asserted) is encountered before the fixed-point is reached, then correctness of a design can be inferred.

The number of verification cycles required to perform an exhaustive state space search increases exponentially with the number of state elements (e.g., registers, latches, flip-flops, etc.). This exponential relationship makes formal verification impractical for designs containing a large number of state elements (e.g., one-hundred or more state elements). As a result, semi-formal verification has been employed as a verification technique for large designs. Semi-formal verification leverages formal algorithms by applying the formal algorithms to larger designs in a resource-bounded manner. While requiring less computation time (as compared to formal verification), semi-formal verification may only achieve partial verification coverage.

SUMMARY

According to one aspect of the present disclosure, a technique for performing an analysis of a logic design (that includes a native memory array embodied in a netlist) includes detecting an initial transient behavior in the logic design as embodied in the netlist. The technique also includes determining a duration of the initial transient behavior and gathering reduction information on the logic design based on the initial transient behavior. The netlist is then modified based on the reduction information.

According to another aspect of the present disclosure, a technique for performing an analysis of a logic design (that includes a native memory array embodied in a netlist) includes applying a first constraint on an analysis of the logic design. In this case, the native memory array includes one or more read ports, one or more write ports, and one or more initialization ports. The first constraint provides that all pins of each of the one or more read ports has a same lag and all pins of each of the one or more write ports has a same lag. The technique also includes applying a second constraint on the analysis of the logic design. The second constraint provides that the one or more initialization ports have zero lag. The technique further includes applying a third constraint on the analysis of the logic design. The third constraint provides that none of the one or more write ports are lagged to a greater degree than any of the one or more read ports. The netlist is then retimed based on the first, second, and third constraints.

BRIEF DESCRIPTION OF THE DRAWINGS

The present invention is illustrated by way of example and is not intended to be limited by the accompanying figures, in which like references indicate similar elements. Elements in the figures are illustrated for simplicity and clarity and have not necessarily been drawn to scale.

DETAILED DESCRIPTION

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks. As may be used herein, the term "coupled" includes both a direct electrical connection between blocks or components and an indirect electrical connection between blocks or components achieved using one or more intervening blocks or components. As used herein, the term "native memory array" refers to a memory array that is not bit-blasted.

In general, formal and semi-formal verification techniques provide useful tools for the construction of correct integrated circuit (IC) logic designs (designs). Formal and semi-formal verification techniques may expose uncommon scenarios that result in a functional failure of a design or prove that the design is correct, i.e., that no failing scenario exists. Unfortunately, formal verification techniques require computational resources that are exponential with respect to the size of a design under test. As such, semi-formal verification techniques, which provide incomplete verification coverage, are normally used to apply formal algorithms to larger designs in a resource-bounded manner.

The concept of transformation-based verification has been proposed to facilitate the use of multiple algorithms, encapsulated as engines of a modular multiple-engine based verification system as disclosed in U.S. Pat. No. 6,698,003, to simplify and decompose complex problems into sub-problems which are usually easier to formally discharge. The transformation-based verification approach has facilitated the scalability of formal verification algorithms to verification problems of industrial relevance. In this case, the bug-hunting power of formal methods are applied to large units of logic which are the common focus of simulation-based testbenches. In general, a testbench includes three components: a driver that includes enough input assumptions to provide meaningful input stimulus; a design under verification; and a checker to verify the correctness of the design under given inputs.

Virtually all industrial hardware formal verification tools bit-blast design components (e.g., memory arrays) into simple primitives, such as 2-input AND gates, inverters, and single-bit state elements. In contrast, logic simulators often support higher-level primitives without bit-blasting. One type of design component which often entails a dramatic bloat when bit-blasted are memory arrays, which are row-addressable two-dimensional state elements that are often used to implement main memory or caches. In a typical design that includes a cache, the cache may be several megabytes and, as such, may present a fatal bottleneck to formal verification tools when the cache is bit-blasted.

Retiming is a technique that may simplify analysis of a design (by relocating state elements across combinational gates to reduce a total number of state elements in the design), while preserving a behavior of the design. For example, given a design with an AND gate and a state element on each input of the AND gate, the state elements may be shifted to an output of the AND gate to reduce the number of state elements while preserving design behavior. The reduction in state elements, which was initially developed as a synthesis transformation, may significantly enhance verification scalability. Transient simplification is a technique which has also proven useful to enhance verification of industrial IC logic designs. Transient simplification identifies logic in a design that is redundant (after a certain number of time-steps) and then simplifies the design by replacing the logic with a constant following the certain number of time-steps. In general, transient simplification enhances verification, particularly through enhancing the scalability of sequential equivalence checking, and may also enhance synthesis.

Previous implementations of retiming and transient simplification have synthesized memory arrays (included in designs) to latches. Unfortunately, for designs with large memory arrays, synthesizing the memory arrays to latches prevents the use of many enhanced verification and synthesis techniques. According to the present disclosure, techniques are disclosed that facilitate the application of retiming and transient simplification to designs with relatively large memory arrays (e.g., one megabyte or larger memory arrays). According to another aspect of the present disclosure, techniques are disclosed to extend retiming in a behavior-preserving manner for application to designs with memory arrays. In general, the disclosed retiming algorithm extensions facilitate optimal (or near optimal) reduction in designs with memory arrays.

As noted above, a design may be defined in terms of a netlist, which includes a directed graph with vertices (representing gates) and edges (representing interconnections between the gates). The gates have associated functions, such as constants, primary inputs (also referred to as random gates), combinational logic such as AND gates, simple sequential elements (e.g., registers), and memory arrays. Registers have two associated components (i.e., next-state functions and initial-value functions). Both next-state functions and initial-value functions are represented as other gates in the graph. Semantically, for a given register, the value appearing at an initial-value gate at time '0' (initialization or reset time) is applied as the value of the register at time 'i' and the value appearing at the next-state function gate at time 'i' is applied as the value of the register at time 'i+1'.

In a typical netlist, memory arrays have been represented with two-dimensional grids of registers (also referred to as 'cells'), arranged in rows and columns. The content of memory arrays are read or written via dedicated 'ports', which includes read ports, initialization ports, and write ports. Each of the ports has an address vector, a data vector, and an enable. The address vector indicates which row is to be accessed. The enable indicates whether or not an associated port is being accessed. The data vector indicates what value is to be written to a given row (if enabled) in the case of a write port or represents the contents present for the given row in case of an enabled read. Initialization ports are specialized write ports which are relevant only at time '0'. Memory arrays have a pre-defined number of rows and columns, a default initial value (in case an unwritten row is read), and an indication of read-before-write versus write-before-read behavior. The write-before-read behavior is relevant in case of a concurrent read and write to the same address (e.g., read-before-write does not return the concurrent write data, whereas write-before-read does). The data contents of a read port are often conservatively randomized in case the read enable is not active or in case the read row is out-of-bounds (e.g., the read address is larger than the pre-defined number of rows for the array).

It should be appreciated that read port data pins, which may be referred to as 'arrayouts', are the only outputs of a memory array (i.e., all other pins of a memory array are inputs). Write ports and initialization ports have a pre-defined precedence that defines which values persist in case of multiple concurrent writes or initializations to the same address. In general, port precedence is irrelevant for read ports as every concurrent read to a given address returns the same data. For example, write ports may be labeled $W\_1, \ldots, W\_n$ in order of increasing precedence, initialization ports may be labeled $I\_1, \ldots, I\_o$ in order of increasing precedence, and read ports may be labeled $R\_1, \ldots, R\_m$.

As mentioned above, transient simplification is a technique that may be useful to simplify a design. Transient simplification identifies signals (either input or internal signals) in a design which have arbitrary values in the first few time-steps after power-on and then settle to a fixed constant signal thereafter. A known transient simplification algorithm is summarized in the following pseudocode:

```
function decomposedVerification(design) {
(line 1) transientSignals := analyzeTernarySim(design)
(line 2) if (transientSignals is empty)
(line 3) return "Cannot decompose verification"
(line 4) maxDuration := maximum amount of time any transientSignals are
    transient
(line 6) // Part 1 of the decomposed verification: bounded verification of
    the transient frames
(line 7) if (BMC(design, maxDuration) == "Counterexample Found")
(line 8) return "Counterexample Found"
(line 9) // Part 2 of the decomposed verification: unbounded verification of
    the simplified, time-shifted design
(line 10) design := timeShift(design, maxDuration)
(line 11) design := simplifyDesign(design, transientSignals)
(line 12) return unboundedVerification(design);
}
```

In the pseudocode immediately above, ternary simulation (see line 1) is used to identify signals that settle to a constant value after a fixed amount of time. Signals that settle to a constant value after a fixed amount of time are referred to as transient signals. The maximum duration during which any of the transient signals is non-constant (transient) is then computed (see line 4).

Verification of a logic design can then be decomposed into two parts (i.e., verification of time-steps before the maximum transient duration and verification of time-steps after the maximum transient). Verification before the maximum transient duration may be performed with, for example, bounded model checking (BMC) (see line 7). Verification after the maximum transient duration can be accomplished with any number of existing verification algorithms. In this case, the design is modified to enable applied algorithms to focus only on the relevant time-steps by shifting the time basis of the design so that time #maxDuration in the original design corresponds to time '0' in the modified design (see line 10). Each transient signal is constant for all time-steps in the modified design and the modified design can be simplified by replacing each transient with the equivalent constant (see line 11). The modified and simplified design can then be passed to an unbounded verification algorithm (see line 12), with successful verification of the design completing the decomposed verification.

Pseudocode for a known memory array-unaware time-shifting algorithm is set forth below:

```
function timeShift(design, timeSteps) {
(line 1) unrolledDesign := concatenate #timeSteps transition relations
(line 3) foreach register in design
(line 4) initialValue[register] := signal in unrolledDesign corresponding to
    register at time timeSteps
(line 6) return design
}
```

In the pseudocode immediately above, the time basis is shifted by modifying the initial state for each register, such that the registers start in any state reachable in #timeSteps steps. The shifting of the time basis makes it appear as though #timeSteps state transitions have appeared before time '0'. To accomplish this, an unrolled version of the design is derived by concatenating several copies of the transition relation (see line 1). The initial value of each register is then set to the instance of the register in the unrolled design that corresponds to time #timeSteps (see line 4).

Example pseudocode for a memory array-aware time-shifting routine for transient simplification according to the present disclosure is set forth below:

```
function timeShift_arrayAware(design, timeSteps) {
(line 1) unrolledDesign := concatenate #timeSteps transition relations
(line 3) foreach register in design
(line 4) initialValue[register] := signal in unrolledDesign corresponding to
    register at time timeSteps
(line 5) foreach time in 0 to timeSteps-1 {
(line 6) foreach array in design {
(line 7) foreach write port in each array {
(line 8) concatenate initialization port(unrolled(write_port.enable),
    unrolled(write_port.address), unrolled(write_port.data))
(line 9) }
(line 10) }
(line 11) }
(line 13) return design
}
```

Figure 4:
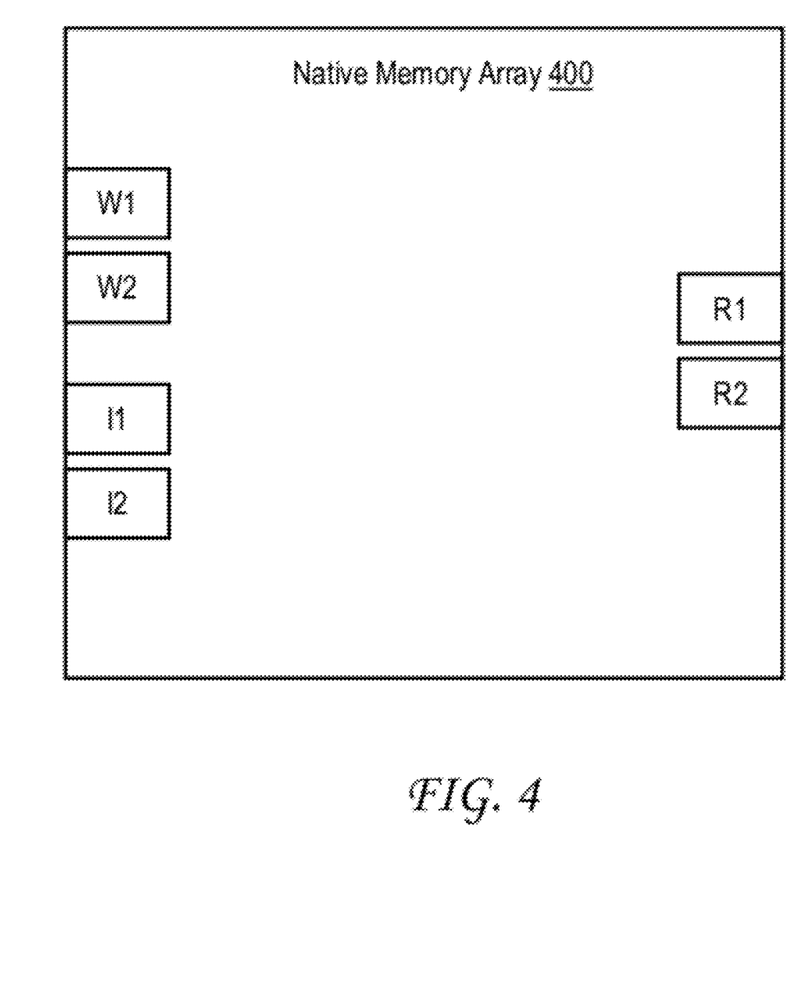
FIG. 4 is a diagram of a native memory array including ports according to other aspects of the present disclosure.

In the pseudocode immediately above, which is configured according to an embodiment of the present disclosure, transient simplification is extended to designs with native memory arrays (as contrasted to designs with bit-blasted memory arrays). In this case, a memory array-aware ternary simulation subroutine is employed to identify transient signals and time-shifting is enhanced to handle memory arrays. As previously noted, native memory arrays (see FIG. 4) have three types of ports (i.e., read, write, and initialization ports) where data can be read from, written to, or used to initialize the memory array, respectively. As is shown in FIG. 4, native memory array 400 includes two read ports (R1 and R2), two write ports (W1 and W2) and two initialization ports (I1 and I2). It should be appreciated that a native memory array, configured according to various embodiment of the present disclosure, may include more or less than two read ports, more or less than two write ports, and more or less than two initialization ports. To make it appear as though #timeSteps state transitions have appeared before time '0', the array write operations occurring in these time-steps are modeled in the memory arrays initial state in the time-shifted design. This can be accomplished by creating initialization ports while time-shifting (see lines 5-11).

In the pseudocode immediately above, iteration is performed over each memory array, each shifted time-step, then each write port in the memory array (see lines 5-7). This facilitates iteration over each write operation in the prefix time-steps, and for each write operation an initialization port is created to model the write in the initial state of the memory array in the time-shifted design (see line 8). The initialization port shares the enable, address, and data signals from the write port, but uses instances of the signals taken from unrolled design. This allows the signals to be evaluated at time '0' in the time-shifted design and still evaluate to the same values as in the original design. It should be noted that the ordering of initialization ports is semantically important, as there is a precedence among ports defining which data persists (i.e., is readable) in case multiple initialization ports exist with the same address. Initialization ports are concatenated in the same precedence order as the write ports and unrolled initialization ports have higher precedence than original initialization ports. In this embodiment, initialization ports for later time-steps have higher precedence than initialization ports of earlier time-steps.

Figure 1:
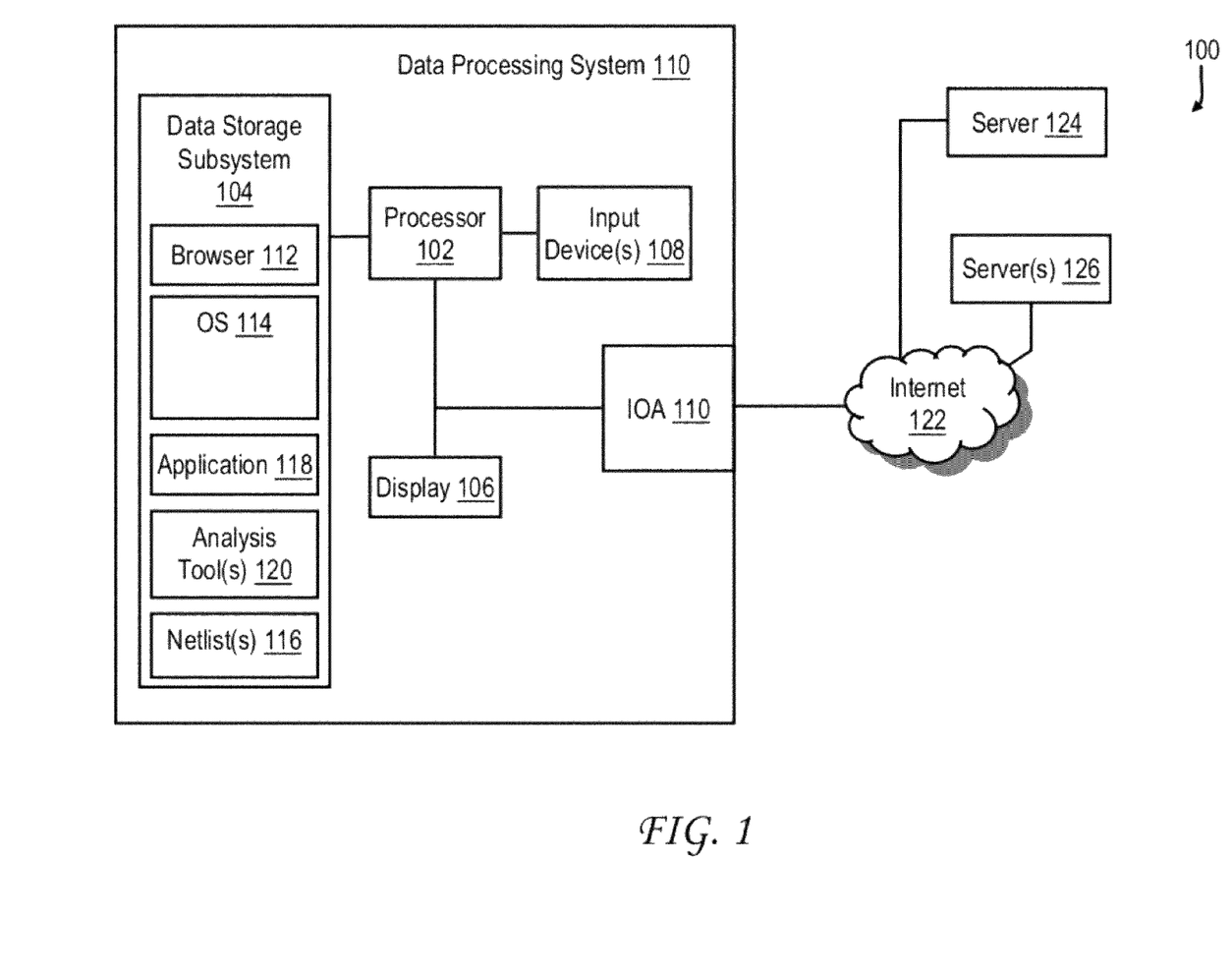
FIG. 1 is a block diagram of an exemplary data processing environment that may be configured to perform an analysis on a netlist according to various aspects of the present disclosure.

With reference to FIG. 1, an exemplary data processing environment 100 is illustrated that includes a data processing system 110 that is configured to execute one or more analysis tools to analyze a logic design for correct operation. Data processing system 110 may take various forms, such as workstations, laptop computer systems, notebook computer systems, or desktop computer systems and/or clusters thereof. Data processing system 110 includes a processor 102 (which may include one or more processor cores for executing program code) coupled to a data storage subsystem 104, a display 106, one or more input devices 108, and an input/output adapter (IOA) 109. Data storage subsystem 104 may include, for example, an application appropriate amount of volatile memory (e.g., dynamic random access memory (DRAM)), non-volatile memory (e.g., read-only memory (ROM) or static RAM), and/or non-volatile mass storage device, such as a magnetic or optical disk drive. Data storage subsystem 104 includes an operating system (OS) 114 for data processing system 110, as well as application programs, such as a browser 112 (which may optionally include customized plug-ins to support various client applications), analysis tool(s) 120 (which may include, for example, verification, simulation, and/or synthesis tools), other applications (e.g., a word processing application, a presentation application, and an email application) 118, and a logic design embodied in netlist 116.

As is well known, a browser (or web browser) is a software application that allows a user (at a client) to display and interact with text, images, and other information located on a web page at a website (hosted by an application server) on the World Wide Web or a local area network. Text and images on a web page may contain hyperlinks to other web pages at the same or different website. Browsers allow a user to quickly and easily access information provided on web pages at various websites by traversing hyperlinks. A number of different browsers, e.g., Internet Explorer™, Mozilla Firefox™, Safari™, Opera™, and Netscape™ are currently available for personal computers. In general, browsers are the most commonly used type of hypertext transfer protocol (HTTP) user agent. While browsers are typically used to access web application servers (hereinafter "web servers") that are part of the World Wide Web, browsers can also be used to access information provided by web servers in private networks or content in file systems.

Display 106 may be, for example, a cathode ray tube (CRT) or a liquid crystal display (LCD). Input device(s) 108 of data processing system 110 may include, for example, a mouse, a keyboard, haptic devices, and/or a touch screen. IOA 109 supports communication of data processing system 110 with one or more wired and/or wireless networks utilizing one or more communication protocols, such as 802.x, HTTP, simple mail transfer protocol (SMTP), etc. Data processing system 110 is coupled via one or more wired or wireless networks, such as the Internet 122, to a tool server 124 and various web page servers 126 that provide information of interest to the user of data processing system 110. For example, server 124 may facilitate download of various analysis tools (e.g., verification, simulation, hardware acceleration, or synthesis tools).

Figure 2:
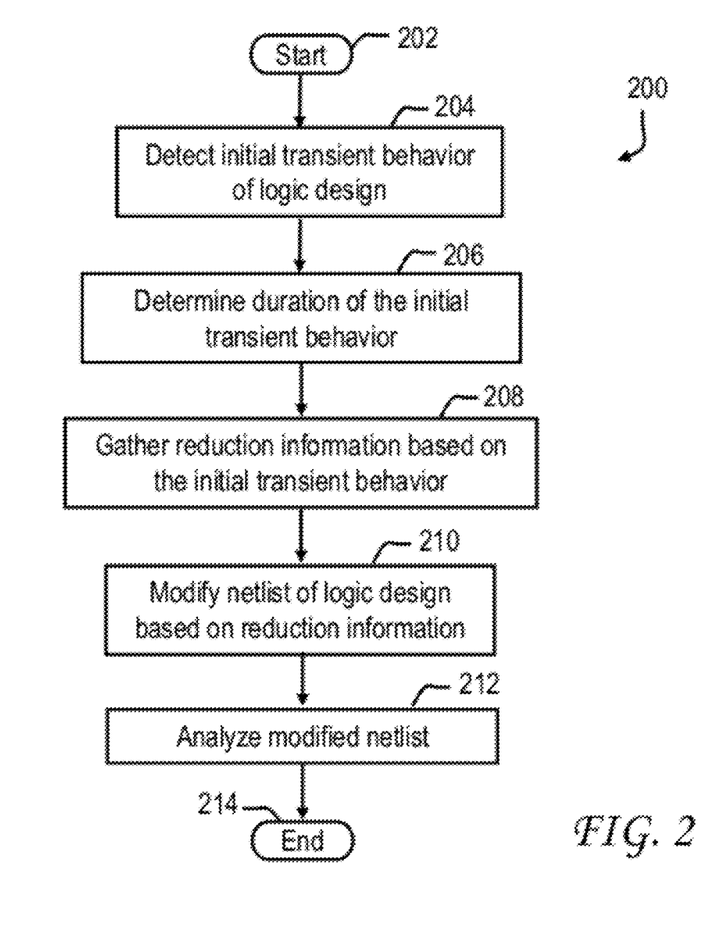
FIG. 2 is a flowchart of an exemplary process for performing an analysis of a logic design that includes a native memory array according to various aspects of the present disclosure.

With reference to FIG. 2, an exemplary process 200 is illustrated that analyzes an IC logic design (embodied in a netlist) according to various aspects of the present disclosure. Process 200 is initiated at block 202 by data processing system 110. Process 200 then proceeds to block 204, where data processing system 110 detects an initial transient behavior in a logic design including a native memory array embodied in a netlist 116. For example, data processing system 100 may detect initial transient behavior by employing the memory array-aware ternary simulation subroutine disclosed herein. The initial transient behavior may, for example, be associated with one or more transient signals (as well as one or more initialization inputs). As noted above, processing a memory array as described herein (i.e., without bit-blasting the memory array to latches) prevents memory bloat and the problems associated therewith during analysis.

Next, in block 206, data processing system 110 determines a duration of the initial transient behavior, which corresponds to a maximum amount of time any detected transient signals are transient. Then, in block 208, data processing system 110 gathers reduction information (i.e., which gates settled to constants) based on the initial transient behavior. Next, in block 210, data processing system 110 modifies netlist 116 (i.e., the original netlist) based on the reduction information. Netlist 116 may be modified by eliminating transient logic from the logic design by decomposing an unbounded verification problem into a bounded verification problem over initial time-steps (during which the initial transient behavior occurs) and an unbounded verification problem over post-transient time-steps (that are subsequent to the initial time-steps). In this case, the unbounded verification is simplified over the post-transient time-steps by treating all transients as having settled to post-transient constant values. Then, in block 212 the modified netlist is analyzed using one or more analysis tools (e.g., verification, simulation, and/or synthesis tools). Following block 212, control transfers to block 214, where process 200 terminates and control returns to a calling routine.

According to another aspect of the present disclosure, retiming is extended to yield optimal (or near optimal) IC logic design reductions for designs that include memory arrays, while facilitating semantic-preserving behavior. As mentioned above, retiming is a technique to reduce the number of state elements in a design by shifting the state elements across combinational gates. The number of state elements shifted backward across a given gate is referred to as the 'lag' of the gate. The lag of a gate represents the number of time-steps that the gate after retiming delays the valuations of the gate before retiming. To ensure consistent initial values between a retimed netlist and an original netlist, normalization may be performed so that only forward retiming (i.e., moving state elements from inputs to outputs of gates) is performed by globally shifting all lags.

The risk of backward retiming with initial values may be appreciated from the following example. Assume that a netlist has one AND gate with respective registers at each output (of the AND gate) and an initial value of each of the registers differs. If the registers are backward retimed to the inputs of the AND gate there is no initial value for the retimed registers that preserves the initial behavior of the original netlist. In general, forward retiming is guaranteed to have a corresponding initial value, by merely applying the function of the gate being retimed across to the initial values of the registers being retimed. An unrolling approach is then used, similar to the unrolling approach set forth above for transient simplification, to effectively fill in time frames of retimed netlist behavior which otherwise would be lost due to forward retiming. An original gate is sometimes referred to as the 'steady-state' representation of the gate, comprising post-prefix design behavior.

Retiming has been demonstrated to be a useful technique to enhance verification, due to the ability of retiming to reduce state element count in a design. However, the use of retiming, as a simplifying pre-processing technique for designs with memory arrays, is a non-trivial problem. As previously noted, it is generally desirable to preserve an overall memory array structure (as contrasted with bit-blasting the memory array to latches) so as to avoid unacceptable memory bloat. To ensure that retiming yields a modified design that is consistent, a retiming solution space is constrained, according to an embodiment of the present disclosure, as follows: all pins of each read and write port are constrained to have an identical lag to ensure that all pins of a given memory array port are lagged by the same amount (so that the port may be evaluated consistently and atomically); no initialization port is lagged to ensure that initialization ports retain their semantics at time '0'; and no write port is lagged to a greater degree than any read port to ensure that a read does not return newer data than a write.

The retiming problem is often formulated as an integer linear program, where each edge in the netlist graph from combinational node to combinational node is annotated by its weight (which represents the number of registers along the edge) and the objective of the problem is to minimize the sum of the retimed weights of the edges of the netlist (taking into account lags). In particular, for each edge 'e' in the circuit graph representing a combinational gate 'u' to combinational gate 'v' connection, the retimed weight, w_r(e) is defined as w_r(e)=w(e)+r(v)+r(u), where w(e) refers to the weight of edge 'e' and r(v) refers to the lag of combinational gate 'v' (i.e., the number of registers retimed backward across the gate). To ensure the above constraints are met, each pin of the same port of the same array is treated as the same gate. In other words, for each port, each enable and address pin of each particular port is treated as the same sink 'v'.

For each initialization and write port, data pins are also treated as the same sink 'v' along with enables and addresses. For read ports, data output pins are treated as the same gate 'v' as the enables and addresses, though for read ports the data pins are considered sources (referred to as 'u' versus 'v'). It should be noted that for distinct ports and addresses, a distinct representative gate 'v' may be used, enabling greater flexibility and, thus, optimizing an overall retiming solution. To meet this requirement a constraint may be added that lag r(v)=0 for every pin of every initialization port. However, the constraint that lag r(v)=0 for every pin of every initialization port may place suboptimal constraints upon the retiming solution.

As such, the constraint that all pins of each read and write port have identical lag may be employed while addressing the time reference of the initialization ports. The constraint that all pins of each port have identical lag may be enforced by adding constraints of the form r(v1)<=r(v2) for each array, where v1 refers to one write port and v2 refers to one read port, while noting that normalized lags are all negative. An optional suboptimal shortcut, though one which may be simpler to solve, is to further represent both v1 and v2 as the same gate (i.e., to further alias write and read ports). The shortcut simplifies the representation of the retimed array and avoids the need for precomputation (as discussed below), at the cost of suboptimal solution.

According to another aspect of the present disclosure, the disclosed retiming solutions may be used for property-preserving verification or synthesis. In this case, for each pin of each original initialization port, a corresponding pin is connected to an unrolled gate representing the time '0' unrolling of the gate originally connected to the corresponding initialization port pin. To enable the proper representation of lagged write ports for prefix time-steps, if the write port was forward retimed by T time-steps, that port T is unrolled T times appending initialization ports with the proper precedence. It should be appreciated that unrolling is used to create gates for the prefix valuations of the ports, which are then connected to new initialization port pins. Proper representation of lagged unfolding of read ports for prefix time-steps is handled (more or less for free) through traditional unfolding through the array. For steady-state behavior (i.e., post-prefix), for each read and write port input pin (i.e., enable pins, address pins, and for write ports also data pins), the input pin is connected to the steady-state copy of the gate originally connected to the input pin. For steady-state behavior (i.e., post-prefix), for each read data output pin, a bypass path is created around the array to allow reading of recent write data that has not yet been written into the array (solely due to write ports being lagged by a different amount than the read port), then finally to fetch data directly from the array if no such bypass is appropriate.

As one example, consider read port R_j lagged by −r(R_j). In this case, each read port R_j is compared to each write port W_k of the same array lagged by less than −r(R_j) to capture necessary bypasses in the retimed netlist to ensure that retimed netlist behave comparably to the original netlist. The bypasses may be handled using precomputation for bypass path synthesis as illustrated in the pseudocode set forth below:

```
if(address of R_j is out-of-bounds or R_j is disabled) then select the
    steady-state unrolling of the gate connected to the corresponding data
    pin of R_j, else
for i in 0 to −r(R_j)−1
for(write port W_k in order of decreasing precedence)
delta = (−r(R_j)) − (−r(W_k))
if(i >= delta) continue
let W_ki represent the i+1 time-frame precomputed version of port W_k
if(W_ki is enabled and W_ki address-matches R_j) then build select
W_ki, else select the corresponding data pin of R_j
```

Precomputation is a technique that may be employed to obtain a value that would appear at a gate in a future time-frame. For example, the '1 time-frame precomputation' of a register is equal to the gate connected to its next-state function. The '1 time-frame precomputation' of an AND gate is the conjunction of the '1 time-frame precomputation' of the inputs of the AND gate.

The precomputation of a constant node is the corresponding constant. Precomputation is performed on a netlist by unrolling (similar to the procedures mentioned above, although always referring to original gates in the netlist versus in-lined initial values). For example, the '1 time-frame precomputation' of a register is equal to the gate connected to the next-state function of the gate, as contrasted with the initial value of the gate. A complication may arise when a random gate is precomputed, as there are no registers in the fan-in of a random gate through which to unroll. Precomputing a random gate may be handled by borrowing registers from a corresponding random gate, similar to forward retiming of a random gate (i.e., the original random gate is replaced by a register whose next-state function is another random gate and whose initial value is another random gate). In this case, borrowing effectively preserves the netlist behavior, as a random value is producible at every time-frame and precomputation may propagate through the newly-introduced register.

Figure 3:
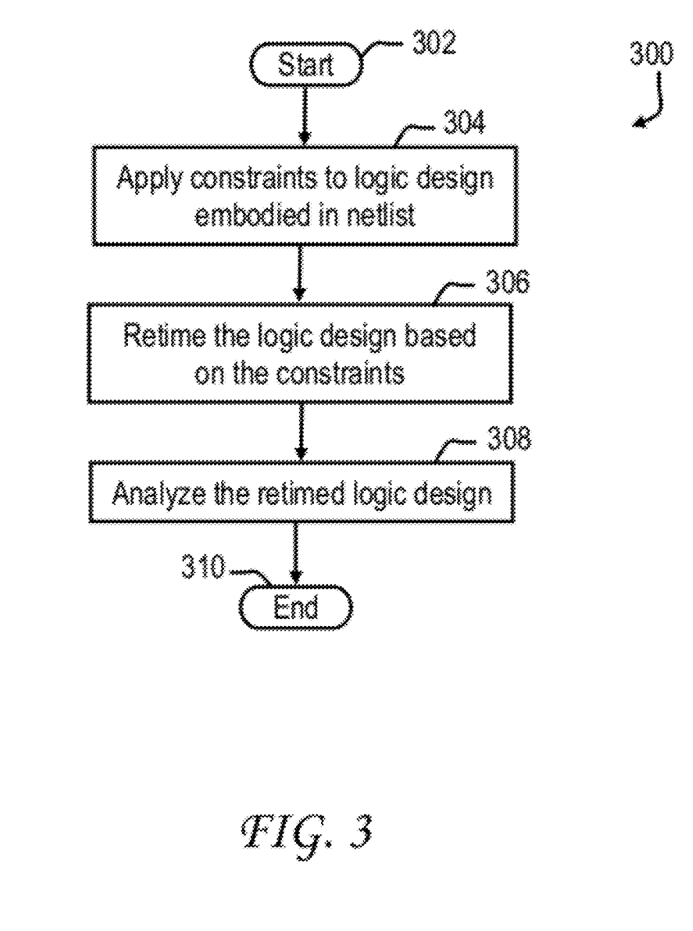
FIG. 3 is a flowchart of an exemplary process for performing an analysis of a logic design that includes a native memory array according to other aspects of the present disclosure.

With reference to FIG. 3, an exemplary process 300 is illustrated that analyzes an IC logic design (embodied in a netlist) according to various aspects of the present disclosure. Process 300 is initiated at block 302 by data processing system 110. Process 300 then proceeds to block 304, where data processing system 110 applies various constraints to a logic design (that includes a native memory array) embodied in a netlist. In various embodiments, data processing system 110 applies a first constraint on an analysis of the logic design that includes a native memory array that includes one or more read ports, one or more write ports, and one or more initialization ports. The first constraint provides that all pins of each of the one or more read ports have a same lag and that all pins of each of the one or more write ports have a same lag.

Data processing system 110 also applies a second constraint on the analysis of the logic design that provides that the one or more initialization ports have zero lag. Data processing system 110 also applies a third constraint on the analysis of the logic design. The third constraint provides that none of the one or more write ports are lagged to a greater degree than any of the one or more read ports. It should be appreciated that other constraints may be applied to retiming a netlist according to the present disclosure. For example, a fourth constraint on the analysis of the logic design may be employed that provides a lag of the one or more write ports is equal to a lag of the one or more read ports. Next, in block 306, data processing system 110 retimes the netlist based on the applied constraints (e.g., the first, second, and third constraints). Then, in block 308 process 300 analyzes the retimed logic design using one or more analysis tools (e.g., verification, simulation, and/or synthesis tools). Following block 308 process 300 transfers to block 310, where control returns to a calling routine.

Accordingly, a number of techniques have been disclosed herein that generally improve retiming and transient simplification of netlists that include native memory arrays. The disclosed techniques can be applied to a given logic design individually or in combination.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to preferred embodiments thereof, it will be apparent that modifications and variations are possible without departing from the scope of the invention defined in the appended claims.

What is claimed is:

1. A method for performing an analysis of a logic design, comprising:
    detecting, using a data processing system, an initial transient behavior in a logic design embodied in a netlist, wherein the logic design as embodied in the netlist includes a native memory array that includes a read port and a write port;
    determining, using the data processing system, a duration of the initial transient behavior;
    gathering, using the data processing system, reduction information on the logic design based on the initial transient behavior;
    modifying, using the data processing system, the netlist based on the reduction information;
    creating using the data processing system, for respective time-steps prior to a maximum transient duration, respective initialization ports for the write port; and
    analyzing, using the data processing system, the logic design after the initial transient behavior based on the respective initialization ports.

2. The method of claim 1, wherein the initial transient behavior is associated with one or more transient signals or initialization inputs.

3. The method of claim 1, wherein the respective initialization ports share enable, address, and data signals of the write port for the respective time-steps, and wherein the respective initialization ports have a precedence order.

4. The method of claim 1, wherein ternary simulation is employed to detect the initial transient behavior in the logic design.

5. The method of claim 1, wherein the modifying the netlist includes eliminating transient logic from the logic design by decomposing an unbounded verification problem into a bounded verification problem over initial time-steps during which the initial transient behavior occurs and an unbounded verification problem over post-transient time-steps that are subsequent to the initial time-steps.

6. The method of claim 5, further comprising simplifying the unbounded verification problem over the post-transient time-steps by treating all transients as having settled to post-transient constant values.

7. The method of claim 1, wherein the analysis corresponds to one of verification, simulation, hardware acceleration, or synthesis.

8. A computer program product embodied on a non-transitory computer readable storage medium, the computer program product including code that, when executed, is configured to cause a data processing system to:
    detect an initial transient behavior in a logic design embodied in a netlist, wherein the logic design as embodied in the netlist includes a native memory array that includes a read port and a write port;
    determine a duration of the initial transient behavior;
    gather reduction information on the logic design based on the initial transient behavior;
    modify the netlist based on the reduction information;
    create, for respective time-steps prior to a maximum transient duration, respective initialization ports for the write port; and
    analyze the logic design after the initial transient behavior based on the respective initialization ports.

9. The computer program product of claim 8, wherein the initial transient behavior is associated with one or more transient signals or initialization inputs.

10. The computer program product of claim 8, wherein the respective initialization ports share enable, address, and data signals of the write port for the respective time-steps, and wherein the respective initialization ports have a precedence order.

11. The computer program product of claim 8, wherein ternary simulation is employed to detect the initial transient behavior in the logic design.

12. The computer program product of claim 8, wherein the code is further configured to eliminate transient logic from the logic design by decomposing an unbounded verification problem into a bounded verification problem over initial time-steps during which the initial transient behavior occurs and an unbounded verification problem over post-transient time-steps that are subsequent to the initial time-steps.

13. The computer program product of claim 12, wherein the analysis corresponds to one of verification, simulation, or synthesis and the code is further configured to simplify the unbounded verification problem over the post-transient time-steps by treating all transients as having settled to post-transient constant values.

14. A system configured for performing an analysis of a logic design, comprising:
    a memory subsystem; and
    one or more processors coupled to the memory system, wherein the one or more processors are configured to:
        detect an initial transient behavior in a logic design embodied in a netlist, wherein the logic design as embodied in the netlist includes a native memory array that includes a read port and a write port;
        determine a duration of the initial transient behavior;
        gather reduction information on the logic design based on the initial transient behavior;
        modify the netlist based on the reduction information;
        create, for respective time-steps prior to a maximum transient duration, respective initialization ports for the write port; and analyze the logic design after the initial transient behavior based on the respective initialization ports.

* * * * *